United States Patent
Mueller et al.

(10) Patent No.: US 7,386,409 B2
(45) Date of Patent: Jun. 10, 2008

(54) METHOD AND APPARATUS FOR ARTIFACT SIGNAL REDUCTION IN SYSTEMS OF MISMATCHED INTERLEAVED DIGITIZERS

(75) Inventors: James Mueller, Chestnut Ridge, NY (US); Peter J. Pupalaikis, Ramsey, NJ (US)

(73) Assignee: LeCroy Corporation, Chestnut Ridge, NY (US)

(*) Notice: Subject to any disclaimer, the term of this patent is extended or adjusted under 35 U.S.C. 154(b) by 0 days.

(21) Appl. No.: 11/280,493

(22) Filed: Nov. 16, 2005

(65) Prior Publication Data

US 2006/0195301 A1    Aug. 31, 2006

Related U.S. Application Data

(60) Provisional application No. 60/656,616, filed on Feb. 25, 2005.

(51) Int. Cl.
*G01R 35/00* (2006.01)
*H04B 15/00* (2006.01)

(52) U.S. Cl. .................... 702/106; 702/191

(58) Field of Classification Search .......... 702/69, 702/70, 106, 190, 191
See application file for complete search history.

(56) References Cited

U.S. PATENT DOCUMENTS

| 4,763,105 | A | 8/1988 | Jenq |
|---|---|---|---|
| 4,962,380 | A | 10/1990 | Meadows |
| 5,239,299 | A | 8/1993 | Apple et al. |
| 5,294,926 | A | 3/1994 | Corcoran |
| 6,269,317 | B1 | 7/2001 | Schachner et al. |
| 6,507,391 | B2 * | 1/2003 | Riley et al. ............ 356/28 |
| 6,567,030 | B1 | 5/2003 | Pupalaikis |
| 6,667,760 | B1 * | 12/2003 | Limberg ............... 348/21 |
| 6,819,279 | B2 | 11/2004 | Pupalaikis |
| 2007/0112532 | A1 * | 5/2007 | Pupalaikis ........... 702/79 |

FOREIGN PATENT DOCUMENTS

WO        2006/093541    *    9/2006

OTHER PUBLICATIONS

Vogel, "The impact of combined channel mismatch effects in time-interleaved ADCs", IEEE Transactions on Instrumentation and Measurement vol. 54, No. 1,(Feb. 2005),415-427.

* cited by examiner

*Primary Examiner*—Michael P Nghiem
(74) *Attorney, Agent, or Firm*—Gordon Kessler

(57) ABSTRACT

An artifact signal correction system may include a mixing component to generate a waveform corresponding to an artifact such as an error tone, whereupon that waveform may be combined with the input waveform to substantially eliminate the artifact. In preferred embodiments, a method and apparatus for reducing spurious tones in systems of mismatched interleaved digitizers due to interleave error is provided. In various embodiments the method may include reversing the frequency content of an input signal, converting the reversed signal into interleave artifact content, delaying the input signal along a parallel path, and then subtracting the interleave content from the delayed input signal.

19 Claims, 6 Drawing Sheets

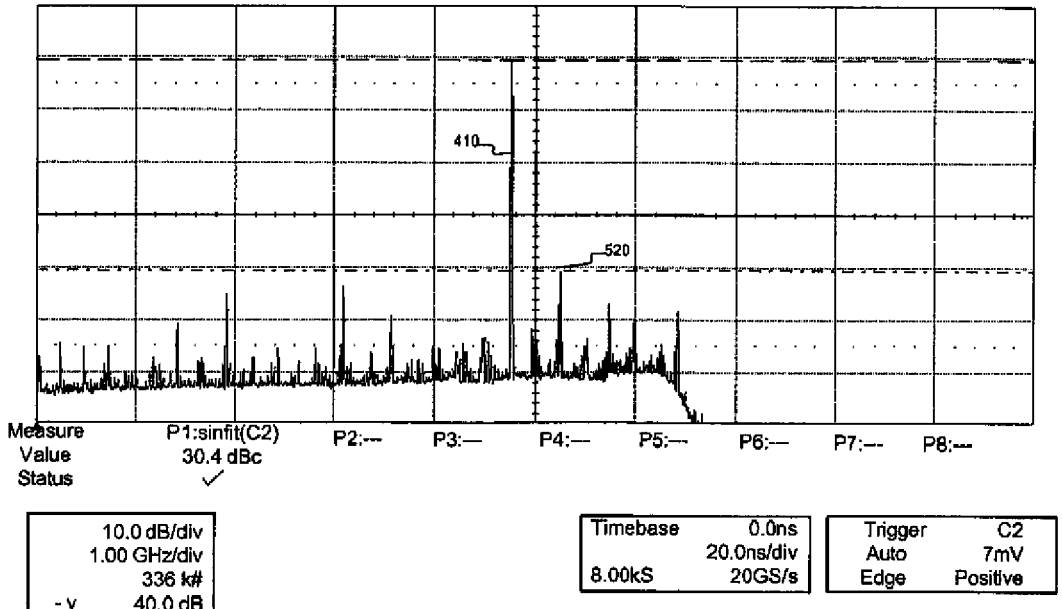

FIG. 5

| Step # | Pseudo code | Comment |
|---|---|---|
| 0 | Measure the frequency response of each digitizer | Calibration phase |
| 1 | Calculate the filter frequency response | This is the response of the filter that converts the mixed input signal into a replica of the interleave artifact |
| 2 | Calculate a filter | For a FIR, this is the impulse response, or filter coefficients that have a response matching the filter frequency response |
| 3 | Calculate the polyphase filter | This is a good optimization step to avoid implementing the mixer, delay element, and summing node |
| 4 | Utilize the polyphase filter to remove interleave artifacts | Implementation phase |

FIG. 6

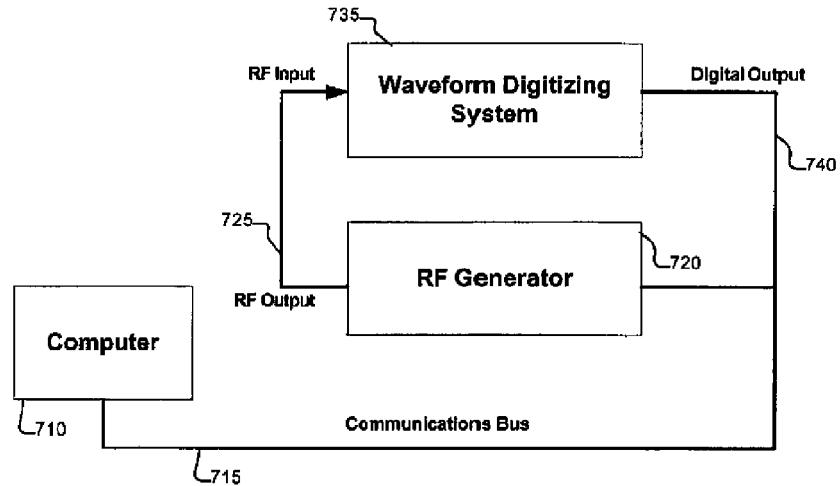

FIG. 7

| Step # | Pseudo code | Comment |
|---|---|---|
| 0 | N+1 is the number of frequency points from DC to Nyquist, inclusive. I is the number of digitizers that are interleaved. A is the number of measurements averaged for each frequency point. | Initialize variables |
| 1 | for n=0 ... N | for each frequency point |
| 2 | $f_{in} = \frac{n}{N} \cdot \frac{Fs}{2}$ | calculate the input frequency |
| 3 | $nd = binacq(f_{in}, \frac{Fs}{I}, ND)$ | calculate the DFT bin in the individual digitizer acquisition |
| 4 | Send command to RF generator to generate desired frequency and amplitude | this code depends on the specific RF generator used |
| 5 | for i=0 ... I-1 | for each digitizer |
| 6 | $RN_{n,i} = 0$ | initialize the accumulator |
| 7 | for a=0 ... A-1 | for each measurement to average |
| 8 | Digitize K points with the waveform digitizer being measured and retrieve them in the vector x | this code depends on the digitizing system being measured |
| 9 | for i=0 ... I-1 | for each digitizer |
| 10 | $XD_i + \frac{1}{K/I} \sum_{k=0}^{K/I-1} x_{k \cdot I + i} \cdot e^{-j \cdot 2\pi \cdot \frac{nd \cdot k}{K/I}}$ | calculate the value of the tone acquired in the DFT of the individual digitizer |
| 11 | $RN_{n,i} = RN_{n,i} + \frac{e^{-j \cdot 2\pi \cdot f_{in} \cdot i \cdot \frac{1}{Fs}} \cdot C\left(f_{in}, \frac{Fs}{I}, XD_i\right)}{A \cdot C\left(f_{in}, \frac{Fs}{I}, XD_0\right)}$ | accumulate the response of digitizer i with respect to digitizer 0 for frequency point n |

FIG. 8

| Step # | Pseudo code | Comment |
|---|---|---|
| 0 | N+1 is the number of frequency points from DC to Nyquist, inclusive<br>I is the number of digitizers that are interleaved.<br>RN is an N by I matrix of the response of digitizer i with respect to digitizer 0 at frequency point n measured previously | Initialize variables |
| 1 | for n=0 ... N | for each frequency point |
| 2 | $H_{N-n} = \dfrac{\sum_{i=0}^{I-1}(-1)^i \cdot \overline{R_{n,i}}}{\sum_{i=0}^{I-1}\overline{R_{n,i}}}$ | Generate the filter response at the frequency point |

FIG. 9

| Step # | Pseudo code | Comment |
|---|---|---|
| 0 | N+1 is the number of frequency points from DC to Nyquist, inclusive.<br>K is twice N and is the number of filter coefficients<br>H is an N point complex vector containing the filter response previously calculated | Initialize variables |
| 1 | for n=0 ... N | for each frequency point |
| 2 | $H'_n = H_n \cdot e^{j \cdot \pi \cdot n}$ | advance (delay) the response by K/2 sample points |
| 3 | for n=1 ... N-1 | for each frequency point, excluding DC and Nyquist |
| 4 | $H'_{N+n} = \overline{H'_{N-n}}$ | fill in the negative frequency spectrum |
| 5 | for k=0 ... K-1 | for each filter coefficient |
| 6 | $h_k = \dfrac{1}{K} \cdot \sum_{n=0}^{K-1} H'_n \cdot e^{j \cdot 2 \cdot \pi \cdot n \cdot \frac{k}{K}}$ | calculate a filter coefficient using the IDFT (optionally, the IFFT can be used) |
| 7 | $w_k = \dfrac{1}{2} - \dfrac{1}{2} \cdot \cos\left(2 \cdot \pi \cdot \dfrac{k}{K}\right)$ | (optionally) calculate a window point (Hanning window shown) |
| 8 | $h_k = h_k \cdot w_k$ | (optionally) apply the window |

FIG. 10

| Step # | Pseudo code | Comment |
|---|---|---|
| 0 | h is a K point vector consisting of the coefficients of a FIR filter previously calculated. It is assumed to have a sample delay of K/2 samples. K is an even number. I is the number of digitizers. | Initialize variables |
| 1 | for k=0 ... K-1 | for each filter coefficient |
| 2 | for i=0 ... I-1 | for each digitizer |
| 3 | $hp_{k,i} = \begin{bmatrix} 1 & if & k = \dfrac{K}{2} \\ 0 & & otherwise \end{bmatrix} \cdot (-1)^{k+i}$ | calculate a polyphase filter coefficient |

FIG. 11

METHOD AND APPARATUS FOR ARTIFACT SIGNAL REDUCTION IN SYSTEMS OF MISMATCHED INTERLEAVED DIGITIZERS

CROSS REFERENCE TO RELATED APPLICATIONS

This application claims the benefit of U.S. Provisional Patent Application Ser. No. 60/656,616, entitled METHOD AND APPARATUS FOR SPURIOUS TONE REDUCTION IN SYSTEMS OF MISMATCHED INTERLEAVED DIGITIZERS, filed Feb. 25, 2005.

FIELD OF THE INVENTION

Sampled data systems and, in particular embodiments, to sampled data systems such as digital sampling oscilloscopes (DSOs) consisting of multiple, interleaved analog-to-digital converters (ADCs) with mismatched frequency response characteristics.

BACKGROUND OF THE INVENTION

The goal of a sampled data system is to accurately acquire an analog signal. The required sample rate of the sampling system is dictated by the bandwidth of the analog signal to be acquired. The sample rate of the sampling system is usually at least twice that of the highest frequency being digitized. This is often called the "Nyquist rate"

Often this sample rate parameter cannot be met with a single analog-to-digital converter (or ADC), which is one type of digitizing element commonly used in this application. For this reason, a technique called interleaving is often employed. Interleaving is a technique whereby multiple digitizing elements sample the analog signal offset in time. For example, in a system having a two ADCs, the first ADC samples the signal, then the second ADC samples the signal, then the first and so on. The digital output of the ADCs may then be multiplexed or otherwise combined to yield a composite digital corresponding to the analog input signal. Use of interleaving accordingly eases the speed requirements of each of the individual ADCs.

Use of interleaving in digital oscilloscopes may accordingly provide the significant advantage of increasing the effective bandwidth of the oscilloscope. With a given set of ADCs, a substantially higher sample rate may be achieved with the use of interleaving. Increasing the sample rate correspondingly increases the maximum frequency that may be sampled by the system, which is commonly called the "bandwidth" of the oscilloscope. The term bandwidth actually refers to a frequency range rather than an upper limit. The lower end of the range is generally understood to be around 0 Hz for an oscilloscope, so the bandwidth of an oscilloscope generally corresponds to the maximum frequency that can be sampled by the system. Thus, a two-fold increase in sample rate generally yields around a two-fold increase in oscilloscope bandwidth.

However, use of interleaving usually requires matching of the timing relationship, gain, and offset of each digitizing element. When digitizers are mismatched in these characteristics the accuracy of the digitized waveform is compromised.

The quality of sampled data systems may be measured by a variety of specifications. Applicable specifications include spurious free dynamic range (SFDR), signal to noise and distortion ratio (SINAD), and effective number of bits (ENOB). SFDR is the size of the largest spurious tone (called a spur) relative to the size of the desired tone acquired (usually in dB). SINAD is the power of the desired tone acquired relative to the power of all noise and distortion components. ENOB is directly related to SINAD through a simple equation and decreases by one for each 6 dB reduction in SINAD.

One symptom of mismatched digitizers is error signal generation. One type of error signal is an artifact signal created by digital signal processing techniques. One type of artifact signal is a spurious tone. When multiple digitizers work in an interleaved configuration to digitize a waveform and a single tone is applied to the system, multiple tones result. The frequency location of the spurious tones is determined by the input frequency and the number of digitizers employed. The magnitude and phase of the spurious tones is determined by the input frequency magnitude and phase, as well as the response characteristics of the individual digitizers, including the response characteristics of the various signal paths leading to each digitizing element. These spurious tones serve to degrade the quality of the digitizing system, as measured with the aforementioned specifications.

A goal in the design of an interleaved system is to match the digitizer characteristics thereby reducing the size of the spurs. This goal can be more readily achieved when all of the digitizers utilized are housed in the same chip, thereby matching in construction and thermal characteristics and have very short paths from chip input to individual digitizer input. Attaining acceptable digitizer matching is significantly more difficult where digitizers are located on separate chips, manufactured in different lots and have long paths from the point that the analog signal is split to the chip inputs. Often, this causes the digitizer response characteristics to be mismatched in a frequency dependent manner.

SUMMARY OF THE INVENTION

An artifact signal correction system may include a mixing component to generate a waveform corresponding to an artifact such as an error tone, whereupon that waveform may be combined with the input waveform to substantially eliminate the artifact. In an interleaved digitizer embodiment, an input waveform and a periodic digital waveform are fed into a mixer to generate a mixed waveform with substantially the same frequency content as the input waveform except that the frequency is reversed and the phase content is negative. The periodic digital waveform may be synchronized to the digitizing elements such that the waveform has a positive magnitude during portions of the waveform sampled by a first digitizing element and a negative magnitude during portions of the waveform sampled by a second digitizing element. The mixed waveform may then be input to a digital filter that converts the phase and amplitude of the error tone to substantially the same phase and amplitude of the corresponding tones in input waveform. The converted and mixed waveform may then be synchronized with the input waveform by applying a delay to the input waveform that accommodates the aforementioned mixing and converting operations. An inverted version of the mixed waveform may then be added to the input waveform so as to substantially reduce or eliminate the error tones.

Particular embodiments of the invention can be implemented to realize one or more of the following advantages. First, interleaving may be implemented without introduction of significant error tones in the composite signal, which in turn may significantly increase the effective bandwidth of the system. Second, a greater number of digitizing elements can be used without introduction of commensurately more error tones or more prominent error tones. For example, four ADCs could be used in an oscilloscope system to increase the bandwidth by about a factor of four without introduction of compounded error tones. Third, the error correction techniques may permit use of ADCs on separate chips, where digitizer mismatch may be particularly acute. This in turn may permit the use of faster components that generate more heat or consume larger amounts of area on an IC die.

The details of one or more embodiments of the invention are set forth in the accompanying drawings and the description below. Other features, aspects, and advantages of the invention will become apparent from the description, the drawings, and the claims.

BRIEF DESCRIPTION OF DRAWINGS

For a more complete understanding of the preferred embodiments, reference is made to the following description and accompanying drawings, in which:

FIG. 5 demonstrates the a spurious tone that has been significantly reduced;

FIG. 6 is a Nasi-Schneiderrnan (NS) diagram describing the calibration phase through an illustrative implementation method;

FIG. 7 is a block diagram of a waveform digitizing system in a calibration arrangement;

FIG. 8 is an NS diagram of a calibration phase that measures the response characteristics of each digitizer;

FIG. 9 is an NS diagram showing how the digitizer response characteristics measured and calculated in the process of FIG. 8 are converted into digital filter response characteristics;

FIG. 10 is an NS diagram showing how the digital filter response characteristics calculated in the process of FIG. 9 are converted into a digital filter; and FIG. 11 is an NS diagram showing how the digital filter calculated in the process of FIG. 10 is converted into a polyphase digital filter implementation.

Like reference numbers and designations in the various drawings indicate like elements.

DETAILED DESCRIPTION OF THE PREFERRED EMBODIMENTS

A system employing two interleaved digitizers such as ADCs may sample an analog waveform such that in an output digitized waveform each digitizer provides every other point. These digitizers, while the timing, gain and offset characteristics might be matched at a single frequency, are mismatched in frequency response and therefore, when an input tone is applied at an arbitrary frequency, not only is the output tone present in the interleaved signal, but also an error tone is present. This error tone is generally located at a frequency that is half the overall sample rate minus the frequency applied. This tone also generally has predictable characteristics that are a function of the input tone applied and the measurable response characteristics of each of the digitizers.

Figure 4:
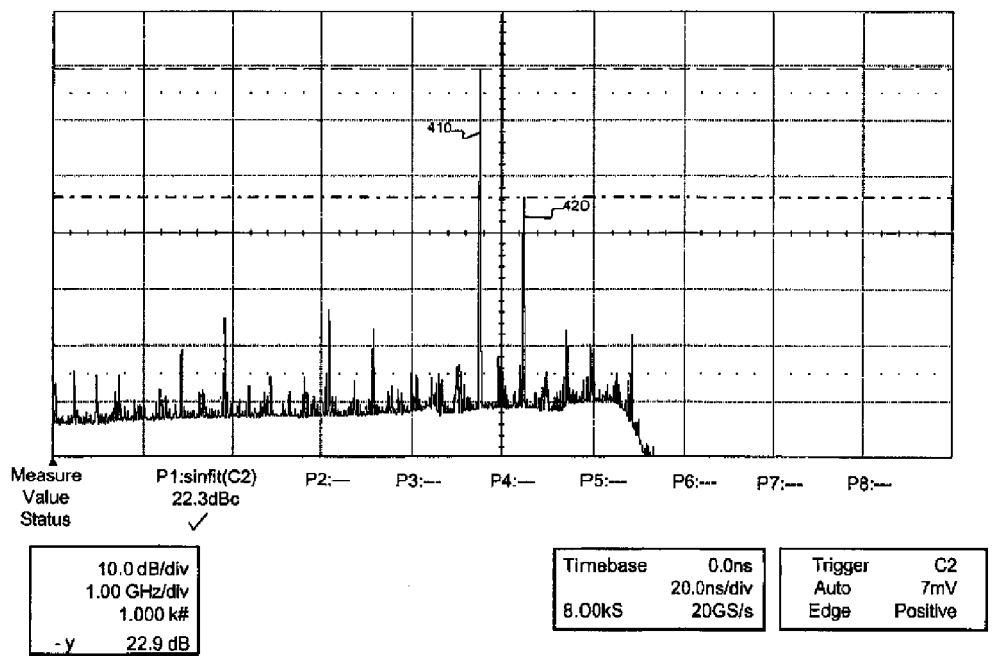
FIG. 4 is a graph showing a spurious tone.

An error tone is illustrated in FIG. 4. The data in this figure was taken from a system including two 10 GS/s digitizers interleaved to form a 20 GS/s acquisition. Each of the two 10 GS/s digitizers consisted internally of six 1.667 GS/s digitizers interleaved, but these digitizers were matched sufficiently such that the system may be viewed as simply two interleaved 10 GS/s digitizers. In FIG. 4, a 4.75 GHz tone [410] is applied and this tone is captured, along with an error tone [420] located at 5.25 GHz, precisely half the overall sample rate of 20 GS/s minus 4.75 GHz. It can be seen that this tone serves to reduce the SFDR of the system to −22.9 dB and reduces the SINAD of the system to 22.3 dB with a corresponding ENOB of 3.4.

Figure 1:
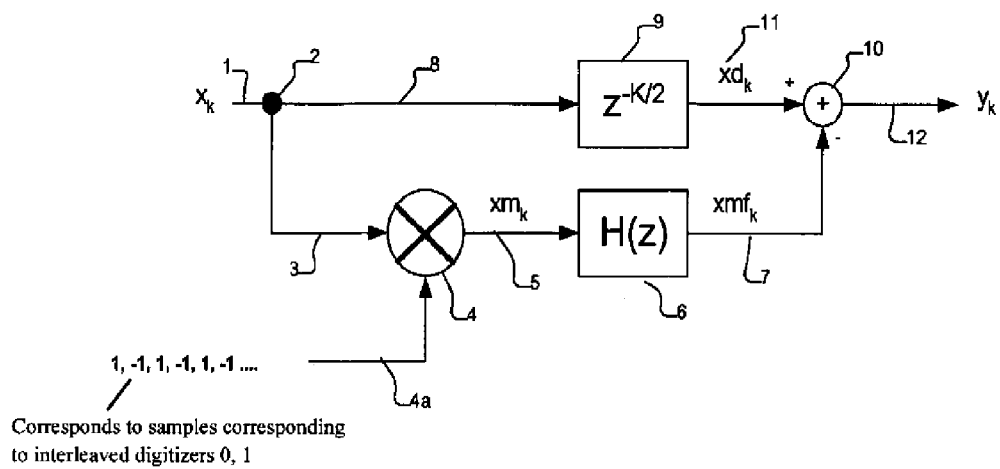
FIG. 1 is a block diagram of the system that removes spurious tones due to interleave error that is illustrative.

An exemplary mixing and filtration system to reduce error tones is shown in FIG. 1. In FIG. 1, the input waveform [1] is split [2]. Along a lower path [3], the waveform enters an RF input of mixer [4]. The local oscillator input [4a] of mixer [4] is fed with an alternating sequence of +1, −1, +1, −1, adjusted so that +1 corresponds to samples taken in the input waveform [1] by samples corresponding the digitizer designated digitizer 0 and −1 corresponds to samples taken in the input waveform [1] by samples corresponding the digitizer designated digitizer 1. The assignment of the digitizer number is arbitrary but should be consistent throughout. The mixer [4] output produces the waveform designated xm [5]. Because of the mixing action, the waveform xm [5] has the characteristic in that it has the exact frequency content of the input waveform [1], except that the frequency is reversed and the phase content is the negative. In other words, given a tone in the input waveform [1] with a given amplitude of A, a phase of θ occurring at a frequency f in a digital waveform with a sample rate of Fs. This same tone would appear in xm [5] with the same amplitude A, but with a phase of −θ, and would occur at Fs/2 minus f. Note that the tone appearing in xm [5] appears at the same location as the interleaving error tone in the input waveform [1] due the application of the tone applied at frequency f. Waveform xm [5] is then applied to a digital filter [6] whose frequency response has been carefully contrived to provide a response such that tones in xm [5] are converted into the exact same amplitude and phase of the interleave error tone in the input waveform [1]. As such, the output of the digital filter designated xmf [7] is a replication of the interleave error tone. Because digital filters generally have some amount of delay associated with them, the input waveform [1] appearing on the upper path [8] is delayed an amount that compensates for the delay associated with digital filter [6]. In FIG. 1, a simplifying assumption has been made that the digital filter [6] is a K point FIR with a sample delay of K/2 sample points, so the delay element [9] is shown delaying the input waveform by that amount. The output of the delay element is designated xd [11]. xd [11] and xmf [7] arrive at a summing node [10] with xd [11] containing a delayed version of the input waveform [1] containing the desired tone and the interleave error tone and xmf [7] containing (to a reasonable approximation) only a delayed version of the interleave error tone. The summing node [10] subtracts xmf [7] from xd [11] resulting in reduction or removal of the interleave error tone in an output signal y [12].

Figure 2:
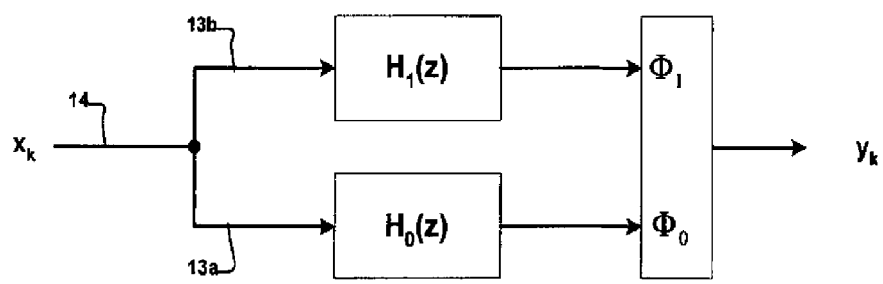
FIG. 2 is a block diagram of an implementation according to FIG. 1 in a polyphase filter arrangement.
Figure 3:
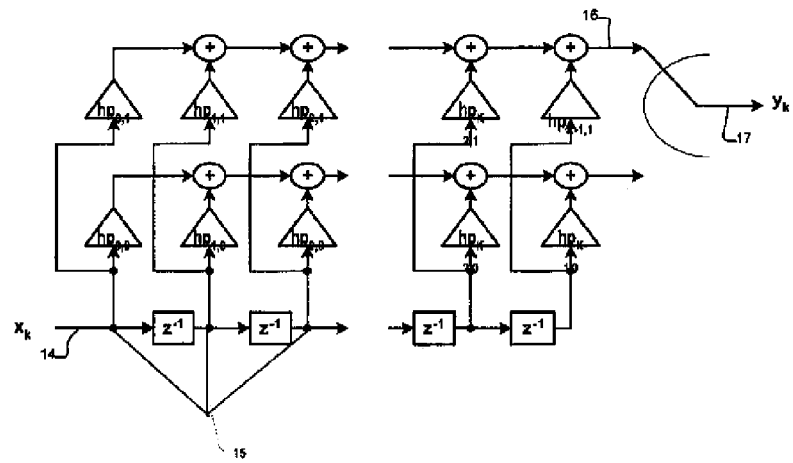
FIG. 3 is a schematic of the polyphase filter arrangement of FIG. 2.

The system implemented in FIG. 1 can be implemented in accordance with the invention as a polyphase filter arrangement shown in FIG. 2 with an internal filter arrangement as shown in FIG. 3. This filter arrangement is an optimization of FIG. 1 that allows for more streamlined processing. Aside from throughput and implementation details, the effect of the system as shown in FIG. 1 does not differ from that in FIG. 3, assuming the correct calculation of the filter coefficients.

The effect of the application of this system to the waveform in FIG. 4 is shown in FIG. 5. In FIG. 5 you can see that the interleave error artifact [520] has been reduced from −22.9 dBc to −40 dBc without affecting the applied 4.75 GHz tone [410]. The SFDR of the system has been improved from −22.9 to −40, the SINAD has been improved from 22.3 dB to 30.4 dB and the ENOB has been improved from 3.4 to 4.75.

In order to remove spurious tones created by interleaving errors, the relationship of the spurious tones to an input tone based on the input tone characteristics and individual digitizer characteristics should be identified. So, consider the following analog signal representing a single tone with arbitrary amplitude and phase. This tone is acquired by a system with a complex response characteristic R to the specific input frequency:

$$f(t) = A_{in} \cdot |R| \cdot \cos(2 \cdot \pi \cdot f_{in} \cdot t + \theta_{in} + \arg(R)) \qquad \text{Equation 1}$$

K points are then acquired at a sample rate of Fs which is specified to contain an integer number of cycles of the analog waveform:

$$t_k = k \cdot \frac{1}{Fs} \qquad \text{Equation 2}$$

$$x_k = f(t_k) \qquad \text{Equation 3}$$

The discrete Fourier transform (DFT) of this sequence is given by:

$$N = \frac{K}{2} \quad n \in 0 \ldots N \qquad \text{Equation 4}$$

$$X_n = \frac{1}{K} \cdot \sum_k x_k \cdot e^{-j \cdot 2 \cdot \pi \cdot \frac{n \cdot k}{K}}$$

Given the fact that the sequence acquired contains an integer number of cycles and that the input frequency meets the Nyquist limitations of the system, the input frequency is related to the frequency bin of interest in the DFT as follows:

$$n_{in} = 2 \cdot N \cdot \frac{f_{in}}{Fs} \qquad \text{Equation 5}$$

and $$f_{in} = \frac{n_{in}}{N} \cdot \frac{Fs}{2} \qquad \text{Equation 6}$$

The DFT given by X in Equation 4 is zero everywhere except at the frequency bin of interest specified by $n_{in}$ in Equation 5:

$$X_{n_{in}} = \frac{A_{in}}{2} \cdot e^{j\theta} \cdot R \qquad \text{Equation 7}$$

The result obtained in Equation 7 is the objective. It means that a single tone is applied to the system, and when the waveform is digitized, the DFT contains a single frequency bin containing the tone. The DFT calculation in Equation 4 can be written as:

$$X_n = \frac{1}{I} \cdot \sum_{i=0}^{I-1} e^{-j \cdot 2 \cdot \pi \cdot n \cdot \frac{i}{K}} \cdot \frac{1}{\frac{K}{I}} \cdot \sum_{k=0}^{\frac{K}{I}-1} x_{k \cdot I + i} \cdot e^{-j \cdot 2 \cdot \pi \cdot n \cdot \frac{k}{\frac{K}{I}}} \qquad \text{Equation 8}$$

with a further restriction that K be evenly divisible by I.

If multiple interleaved digitizers (whose amount is given by I) are used to sample the waveform, the resultant acquisition can be written as:

$$KD = \frac{K}{I} \quad kd \in 0 \ldots KD - 1 \qquad \text{Equation 9}$$

$$xd_{kd,i} = A_{in} \cdot |R_{n_{in},i}| \cdot \cos(2 \cdot \pi \cdot f_{in} \cdot t_{kd \cdot 2 + i} + \theta_{in} + \arg(R_{n_{in},i}))$$

$$x_k = xd_{\text{floor}\left(\frac{k}{I}\right), \text{mod}(k,I)} \qquad \text{Equation 10}$$

The DFT of the sequences acquired by the individual digitizers are calculated as:

$$ND = \frac{KD}{2} \quad nd \in 0 \ldots ND \qquad \text{Equation 11}$$

$$XD_{nd,i} = \frac{1}{KD} \cdot \sum_{kd} xd_{kd,i} \cdot e^{-j \cdot 2 \cdot \pi \cdot nd \cdot \frac{kd}{KD}}$$

The resultant DFTs of the acquired points on individual digitizers shown in Equation matches a portion of Equation 8. Making a substitution, Equation 8 reads as:

$$X_n = \frac{1}{I} \cdot \sum_{i=0}^{I-1} e^{-j \cdot 2 \cdot \pi \cdot n \cdot \frac{i}{K}} \cdot S(n, ND, XD^{(i)}) \qquad \text{Equation 12}$$

where the function S is defined and utilized as:

$$S(n, N, X) := \begin{vmatrix} n' \leftarrow \text{mod}(n, 2 \cdot N) \\ X' \leftarrow \begin{vmatrix} \overline{X_{2 \cdot N - n'}} & \text{if } n' > N \\ X_{n'} & \text{if } n' \leq N \end{vmatrix} \\ X' \end{vmatrix} \qquad \text{Equation 13}$$

The purpose of the function S is to extract the correct bin and apply the correct sign to the phase of a DFT bin when attempts are made to access bins in Equation 11 beyond its contents.

Equation 12 shows that the DFT of an interleaved acquisition can be obtained by considering the DFTs of the acquisitions obtained by each individual digitizer.

Note that the DFT of the individual digitizers in Equation 11 is zero everywhere except at the bin containing the applied tone. The applied tone, while not violating the Nyquist limitations on the overall interleaved system can and will violate the Nyquist limitations of an individual digitizer. Therefore the actual bin in XD containing the input tone may be calculated using the following functions:

$$facq(f, Fs) = \begin{vmatrix} \mod(f, Fs) & \text{if } \mod(f, Fs) \leq \frac{Fs}{2} \\ Fs - \mod(f, Fs) & \text{otherwise} \end{vmatrix} \quad \text{Equation 14}$$

$$binacq(f, Fs, N) = \frac{facq(f, Fs) \cdot 2 \cdot N}{Fs} \quad \text{Equation 15}$$

$$n_{in\_d} = binacq\left(f_{in}, \frac{Fs}{I}, ND\right) \quad \text{Equation 16}$$

Although there is only one tone present in the DFTs in Equation 11 and these DFTs are summed according to Equation 12 to provide the DFT of the interleaved acquisition, there are multiple tone possibilities for the interleaved DFT. The result of the DFT in Equation are zero everywhere, except at values of n that access the same, non-zero element denoted by Equation 16. This occurs whenever:

$$binacq\left(\frac{n}{N} \cdot \frac{Fs}{2}, \frac{Fs}{I}, ND\right) = n_{in\_d} \quad \text{Equation 17}$$

For a two interleaved digitizer implementation, there are two n values where this occurs: $n=n_{in}$, which is the location of the actual, desired tone and $n=N-n_{in}$, which is the location of a possible interleave error artifact. This means that, in this situation, there are two possible tones in the DFT of the interleaved acquisition:

$$X_{n_{in}} = \frac{1}{I} \cdot \sum_{i=0}^{I-1} e^{-j \cdot 2 \cdot \pi \cdot n_{in} \cdot \frac{i}{K}} \cdot S(n_{in}, ND, XD^{(i)}) \quad \text{Equation 18}$$

and $$X_{N-n_{in}} = \frac{1}{I} \cdot \sum_{i=0}^{I-1} e^{-j \cdot 2 \cdot \pi \cdot (N-n_{in}) \cdot \frac{i}{K}} \cdot S(N-n_{in}, ND, XD^{(i)}) \quad \text{Equation 19}$$

Actual values acquired in XD are substituted, based on the input tone and individual digitizer response characteristics:

$$X_{n_{in}} = \quad \text{Equation 20}$$
$$\frac{1}{I} \cdot \sum_{i=0}^{I-1} e^{-j \cdot 2 \cdot \pi \cdot n_{in} \cdot \frac{i}{K}} \cdot C\left(f_{in}, \frac{Fs}{I}, C\left(f_{in}, \frac{Fs}{I}, \frac{A_{in}}{2} \cdot e^{j\theta_{in}} \cdot R_{n_{in},i} \cdot e^{j \cdot 2 \cdot \pi \cdot n_{in} \cdot \frac{i}{K}}\right)\right)$$

and $$X_{N-n_{in}} = \frac{1}{I} \cdot \sum_{i=0}^{I-1} e^{-j \cdot 2 \cdot \pi \cdot (N-n_{in}) \cdot \frac{i}{K}} \cdot \quad \text{Equation 21}$$
$$C\left(f_{in}, \frac{Fs}{I}, C\left(\frac{Fs}{2} - f_{in}, \frac{Fs}{I}, \frac{A_{in}}{2} \cdot e^{j\theta_{in}} \cdot R_{n_{in},i} \cdot e^{j \cdot 2 \cdot \pi \cdot n_{in} \cdot \frac{i}{K}}\right)\right)$$

where C is a function defined as:

$$C(f, Fs, X) = \begin{vmatrix} X & \text{if } \mod(f, Fs) \leq \frac{Fs}{2} \\ \overline{X} & \text{otherwise} \end{vmatrix} \quad \text{Equation 22}$$

These equations simplify to:

$$X_{n_{in}} = \frac{A_{in}}{2} \cdot e^{j\theta_{in}} \cdot \frac{1}{I} \cdot \sum_{i=0}^{I-1} R_{n_{in},i} \quad \text{Equation 23}$$

and $$X_{N-n_{in}} = \frac{A_{in}}{2} \cdot e^{-j\theta_{in}} \cdot \frac{1}{I} \cdot \sum_{i=0}^{I-1} (-1)^i \cdot \overline{R_{n_{in},i}} \quad \text{Equation 24}$$

Equation 23 and Equation 24 show the locations in and contents of the DFT of the interleaved acquisition of a single tone applied to the system based on the tone applied and the response characteristics of the individual digitizers to the tone.

When R is equal for each digitizer, the result in Equation 24 reduces to the desired result in Equation 7 and the result in Equation 24 goes to zero. In other words, when the digitizers have sufficiently matching characteristics, no spurious tone results. When R is not equal for each digitizer, the result is the input tone in Equation 23 and an interleave error artifact in Equation 24. Equation 23 and Equation 24 show that there is an exact relationship of the error tone to the desired tone based on the input tone and the digitizer characteristics.

Using this relationship, in accordance with the invention a system and method are provided that when a desired tone and an interleave error tone are acquired, the interleave error tone may be reproduced so that it may be subtracted from the acquired signal.

The first step in providing this feature is to perform a frequency translation. The component located at $f_{in}$ to $$\frac{Fs}{2} - f_{in}$$

may be removed utilizing a digital mixer:

$$A_{in} \cdot \cos\left(2 \cdot \pi \cdot \frac{f_{in}}{Fs} \cdot k + \theta_{in}\right) \quad \text{Equation 25}$$

is mixed with $\cos\left(2 \cdot \pi \cdot \frac{Fs}{2} \cdot k \cdot \frac{1}{Fs}\right)$ The mixing signal in Equation 25 is simply an alternating sequence of 1, −1, 1, −1, etc. Employing a trigonometric identity, it can be seen that:

$$A_{in} \cdot \cos(2 \cdot \pi \cdot f_{in} \cdot t + \theta_{in}) \cdot \cos\left(2 \cdot \pi \cdot \frac{Fs}{2} \cdot k \cdot \frac{1}{Fs}\right) \rightarrow$$

$$\frac{A_{in} \cdot \cos\left(2 \cdot \pi \cdot \frac{\left(f_{in} + \frac{Fs}{2}\right)}{Fs} \cdot k + \theta_{in}\right) + A_{in} \cdot \cos\left(2 \cdot \pi \cdot \frac{\left(f_{in} - \frac{Fs}{2}\right)}{Fs} \cdot k + \theta_{in}\right)}{(2)}$$

Equation 26

The tone output from the mixer consists of two tones at sum and difference frequencies. Negative frequencies fold back into the positive spectrum and that by virtue of the fact that this is a sampled system, frequencies appearing above the Nyquist rate appear as aliases below the Nyquist rate. Thus, the result in Equation 26 actually becomes:

$$A_{in} \cdot \cos\left(2 \cdot \pi \cdot \frac{\left(\frac{Fs}{2} - f_{in}\right)}{Fs} \cdot k - \theta_{in}\right)$$

Equation 27

Equation 27 shows that when the desired tone at bin $n_{in}$ in Equation 23 is passed through this mixer, it appears as the complex conjugate at bin $N-n_{in}$. In other words, when the tone in Equation 23, located at $n_{in}$ is applied to the mixer, the result is the following appearing at location $N-n_{in}$, $$\frac{A_{in}}{2} \cdot e^{j\theta_{in}} \cdot \frac{1}{I} \cdot \sum_{i=0}^{I-1} R_{n_{in},i}$$

or $$\frac{A_{in}}{2} \cdot e^{-j\theta_{in}} \cdot \frac{1}{I} \cdot \sum_{i=0}^{I-1} \overline{R_{n_{in},i}}$$

Equation 28

The mixing signal in Equation 25 is simply an alternating sequence of 1, −1, 1, −1, etc.

After this processing because the input tone frequency has been shifted to the same frequency of the interleave error. This means that the possibility now exists to apply a filter to this new tone that would reproduce the interleave error artifact. In other words, the output of the mixer is then applied to a digital filter designed to turn the result of Equation 28 into the result of Equation 24. This can be accomplished if the digital filter is designed to have the following response:

$$H(z) = \frac{\sum_{i=0}^{I-1}(-1)^i \cdot \overline{R_{n_{in},i}}}{\sum_{i=0}^{I-1} R_{n_{in},i}}$$

Equation 29 when evaluated at $$z = e^{j \cdot 2 \left(\frac{Fs}{2} - f_{in}\right) \cdot \frac{1}{Fs}}$$

Equation 30

Therefore, a digital filter with response characteristics as specified in Equation 29 at frequencies specified in Equation 30 is provided in accordance with the invention. When implemented, the output of such a filter is the interleave error artifact. The output of this digital filter is then subtracted from the delayed input signal (to account for any delay incurred by this filter) resulting in an acquisition that has the interleave error artifact removed or suppressed.

A system and method will now be described that implement the above mathematical solution.

Referring to FIG. 6, a process for developing such a error tone cancellation system is shown. All of the steps shown in FIG. 6 will be further described in FIGS. 8, 9, 10, and 11 with a final filter implementation shown in FIG. 3.

Step 0 of FIG. 6 first recites measuring the response of each digitizer with respect to a reference digitizer. Measuring the absolute response of a digitizer is facilitated by knowing the actual input signal amplitude and phase. The system is concerned only with how the digitizers match, not the absolute response of any one, or group of digitizers. Any overall resulting frequency response changes or adjustments that may be necessary as a result of systematic factors that affect all of the digitizers equally can be compensated for by other means.

To measure the response of the digitizers, a calibration arrangement as shown in FIG. 7, and a calibration procedure as shown in FIG. 8 are utilized. Therefore, as is shown in FIGS. 7 and 8, at a step 0, variables are initialized by a computer [710]. Next at a step 1, for each frequency point an input frequency is calculated at a step 2. At a step 3, a DFT bin in the individual digitizer acquisition is determined, and at a step 4 a command is sent from computer [710] via a bus [715] to an RF generator [720] to generate a signal [725] having a desired frequency and amplitude.

Next, at a step 5, for each digitizer in the digitizing system, an accumulator is initialized in a step 6 for each measurement to be averaged in a step 7. At a step 8, digitizing system [735] digitizes the signal 725. Then at a step 9, after digitized values 740 are forwarded to computer 710, at a step 10, for each digitizer, a value of the tone acquired in the DFT of the individual digitizer is determined according to Equation 8. Thereafter in a step 11, the response of digitizer "i" with respect to digitizer "0" for a frequency at a point "n" is accumulated. The result of this process is a matrix RN whose rows correspond to input frequencies and whose columns correspond to digitizer numbers, and whose elements at a given row and column are the response of an individual digitizer with respect to digitizer 0 at a given frequency.

At a step 1 in FIG. 6, the digitizer responses calculated in step 0 are converted into a digital filter response. This digital filter response is the response of digital filter [6] in FIG. 1. This process is described in FIG. 9, in which the various variables are initialized, and then in steps 1 and 2 for each frequency point a frequency response is generated. The result of this process is a vector H whose rows correspond to the complex response of the digital filter at the frequencies specified by the row number.

Referring back to FIG. 6, in a step 2 the digital filter response calculated in step 1 is converted into a digital filter implementation. This is the implementation of the digital filter [6] in FIG. 1. The preferred method of performing this conversion is to utilize the IDFT to generate a FIR. This process is described in FIG. 10. The result of this process is a vector h which are the FIR coefficients. Then, at a step 3 in FIG. 6, the filter generated in step 2 is converted into a filter that can be utilized in a polyphase arrangement as shown in FIGS. 2 and 3.

This process is described in FIG. 11, in which the various variables are initialized in a step 0, and then for each filter coefficient for each digitizer a polyphase filter coefficient is calculated according to the equation shown in FIG. 11 (steps 1-3). The result of this process is a matrix hp which has the same number of rows as the number of filter coefficients calculated previously and the number of columns corresponding to the number of digitizers. Each element in hp is a coefficient of a filter phase where the coefficient number is the row and the phase is the column. Thus, the frequency response of the filters shown in FIG. 2 are described as:

$$H_i(z) = \sum_k hp_{k,i} \cdot z^{-k}$$

Equation 31

A block diagram depicting a filter implementation is shown in FIG. 3. In FIG. 3, an input waveform [14] enters delay taps [15] that are ideally, but not necessarily common to each filter phase (it is sufficient for the waveform to simply enter both filter phases 0 [13a] and 1 [13b] as shown in FIG. 2 and not share delay taps). The output waveform [16] is taken from one phase only utilizing the switch [17] where the switch location connects the output waveform [16] to the filter phase corresponding the ADC sampling phase (i.e. the filter phase is determined by which ADC took the sample). Therefore, the switch selects data in a pattern corresponding to the original digitizing pattern of the analog waveform by the interleaved digitizers.

The polyphase filter shown in FIG. 3 is then implemented in an implementation phase, removing spurious tones created by interleave error, until such time that the system is deemed to be out of calibration. At that time, the process described by steps 0 through 3 of FIG. 6 is repeated to generate new coefficients.

While the foregoing error signal correction techniques may advantageously be deployed in DSOs, the techniques may also be applied in others and other digital systems in which error signals are to be corrected, such protocol analyzers, waveform generators, digitizers, and certain types of active probes.

Likewise, the techniques may be applied to correct error signals other than spurious tones typical of mismatched digitizers. The techniques described above may be applied to isolate and remove undesirable channel response characteristics, echoes, and other systematic error signals. For instance, the techniques can be used to eliminate crossover region phase errors, which occur when a low frequency component is combined with a high frequency component and the roll-off regions of the two components are not phase aligned. The type of error signal is described in more detail in co-pending application Ser. No. 11/280,671, entitled, "Method of Crossover Region Phase Correction when Summing Signals in Multiple Frequency Bands," filed Oct. 22, 2005 by Pupalaikis, the disclosure of which is incorporated herein by reference.

The error correction techniques can also be applied in the analog domain. The equations set forth above can be modified according to the particular the analog application and then used to derive suitable analog topologies according to known design methodologies.

The error correction techniques may advantageously be applied to interleaved systems having three, four or more ADCs that provide a many fold increase in effective bandwidth. In one approach, error tone cancellation circuits may be cascaded. For instance, one error cancellation circuit may accept as inputs the digital signals from the first and second ADCs and another may filter the signals from the third and fourth ADCs. Optionally, another error correction circuit may be used to filter the composite inputs from i) the first and second ADCs and ii) the third and fourth ADCs.

The error correction techniques may advantageously be applied to systems in which the ADCs are disposed on separate chips. Such a topology may be desirable where the fastest available ADC is to be used (which generally runs hotter and consumes more area on an IC die). In one embodiment, each digitizer element is disposed on its own die. In other embodiments, the digitizers are disposed on at least two, three, four, five, six, or more dies.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. An artifact signal correction method comprising the steps of:
   receiving an input signal;
   digitizing the input signal with a plurality of interleaved digitizers;
   reversing the frequency content of the digitized input signal to generate a reversed frequency waveform;
   deriving an artifact content from the reversed frequency waveform, said artifact content corresponding to at least one artifact generated in accordance with the digitizing of the input signal by the plurality of interleaved digitizers;
   delaying the input signal; and
   subtracting the artifact content from the delayed input signal to substantially reduce the at least one artifact.

2. The method of claim 1 wherein the artifact is a tone.

3. The method of claim 2, wherein the artifact is a spurious tone.

4. The method of claim 3, wherein the frequency of the spurious tone (n) is in accordance with the equation:

$$n = N - n_{in}$$

where n is a frequency of the spurious tone, N is one half an overall sample frequency, and $n_{in}$ is the input frequency.

5. The method of claim 1, wherein the artifact is caused at least in part by the digitizing of the input signal by the plurality of interleaved digitizers having one or more mismatches therebetween.

6. The method of claim 1, wherein the digitizers are analog-to-digital converters.

7. The method of claim 1, wherein reversing the frequency content comprises mixing the input signal with a periodic digital waveform.

8. The method of claim 1, wherein deriving the artifact content comprises transforming the reversed frequency waveform.

9. The method of claim 1, wherein delaying the input signal substantially synchronizes the input waveform with the artifact content.

10. The method of claim 1, wherein subtracting comprises combining the input signal with an artifact content that is the substantial inverse of the artifact.

11. The method of claim 1, wherein the interleaved digitizers are disposed on separate dies.

12. The method of claim 1, wherein the at least one artifact comprises an error signal caused at least in part by phase mismatch between two or more signals, each signal being generated from one of the plurality of interleaved digitizers when employed to digitize the input signal.

13. The artifact signal correction method of claim 1, wherein the at least one artifact is caused by crossover region phase misalignment.

14. The method of claim 1, wherein a frequency of the spurious tone is a function of the input signal.

15. An artifact signal correction method comprising the steps of:
    providing an input signal having at least one artifact;
    reversing the frequency content of the input signal to generate a reversed frequency waveform;
    deriving an artifact content from the reversed frequency waveform, said artifact content corresponding to the at least one artifact;
    delaying the input signal; and
    subtracting the artifact content from the delayed input signal to substantially reduce the at least one artifact,
    wherein reversing the frequency content of the input signal comprises flipping the input signal about a frequency at substantially one half an overall sample frequency.

16. A system for reducing interleave error, comprising:
    means for reversing the frequency content of an input signal;
    a converter for converting the reversed frequency content into interleave artifact content;
    a delay element for delaying the input signal; and
    a summing device for subtracting the interleave artifact from the delayed input signal, wherein the reversing means flips the frequency content of the input signal about a frequency at substantially one half an overall sample frequency.

17. A system for reducing interleave error, comprising:
    a receiver for receiving an input signal;
    a plurality of interleaved digitizers for digitizing the input signal;
    means for reversing the frequency content of the digitized input signal;
    a converter for converting the reversed frequency content into interleave artifact content, the artifact content corresponding at least one artifact generated in accordance with the digitizing of the input signal by the plurality of interleaved digitizers;
    a delay element for delaying the input signal; and
    a summing device for subtracting the interleave artifact from the delayed input signal.

18. The system of claim 17, wherein the interleave error is a spurious tone.

19. The system of claim 18, wherein the frequency of the spurious tone (n) is in accordance with the equation:

$$n = N - n_{in}$$

where n is a frequency of the spurious tone, N is one half an overall sample frequency, and $n_{in}$ is the input frequency.

* * * * *